(12) United States Patent
Fornara

(10) Patent No.: US 8,730,707 B2
(45) Date of Patent: May 20, 2014

(54) LOGIC CODING IN AN INTEGRATED CIRCUIT

(75) Inventor: Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 641 days.

(21) Appl. No.: 12/057,535

(22) Filed: Mar. 28, 2008

(65) Prior Publication Data

US 2008/0239786 A1    Oct. 2, 2008

(30) Foreign Application Priority Data

Mar. 29, 2007  (FR) ...................................... 07 54134

(51) Int. Cl.
*G11C 17/10*  (2006.01)
*G11C 17/12*  (2006.01)
*G11C 17/08*  (2006.01)

(52) U.S. Cl.
USPC ............. 365/104; 365/103; 365/94; 257/390; 257/E27.102

(58) Field of Classification Search
USPC ................ 365/103, 104, 63, 94, 95; 257/390, 257/E27.102
See application file for complete search history.

(56) References Cited

U.S. PATENT DOCUMENTS

| | | | |
|---|---|---|---|
| 5,929,494 A | 7/1999 | Li | |
| 6,133,100 A | 10/2000 | Li | |
| 6,243,284 B1 | 6/2001 | Kumagai | |
| 2003/0109126 A1 | 6/2003 | Terasawa et al. | |
| 2005/0112504 A1 | 5/2005 | Terasawa et al. | |
| 2005/0202663 A1* | 9/2005 | Tsuchiaki | 438/587 |
| 2007/0155052 A1 | 7/2007 | Terasawa et al. | |

OTHER PUBLICATIONS

French Search Report from corresponding French Application No. 0754134, filed Mar. 29, 2007.

* cited by examiner

*Primary Examiner* — J. H. Hur
(74) *Attorney, Agent, or Firm* — Wolf, Greenfield & Sacks, P.C.

(57) ABSTRACT

The programming of a read-only memory formed of MOS transistors is set by a mask for forming an insulating layer prior to the forming of contacts of active regions of the transistors. The programming of the read-only memory cannot be determined by visible inspection of the memory.

20 Claims, 5 Drawing Sheets

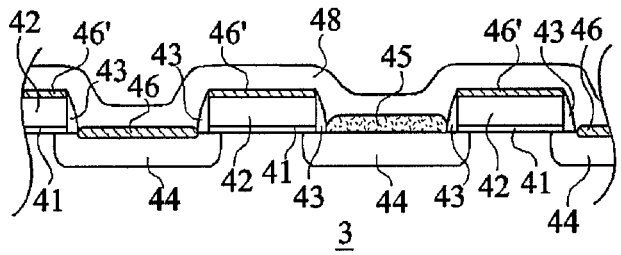
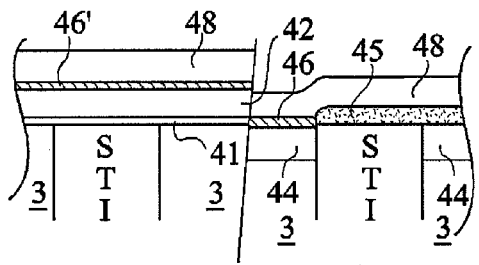
Fig 6F    Fig 7F
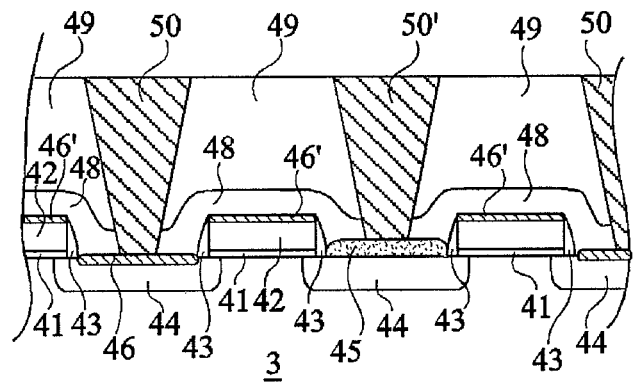
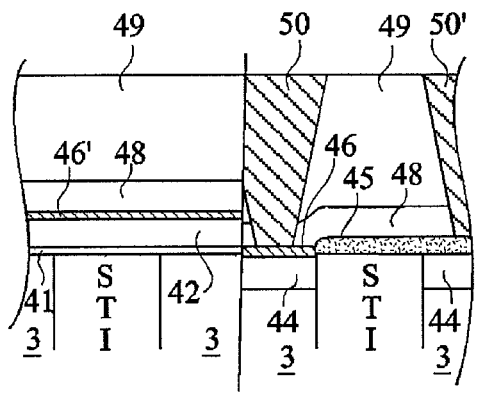
Fig 6G    Fig 7G
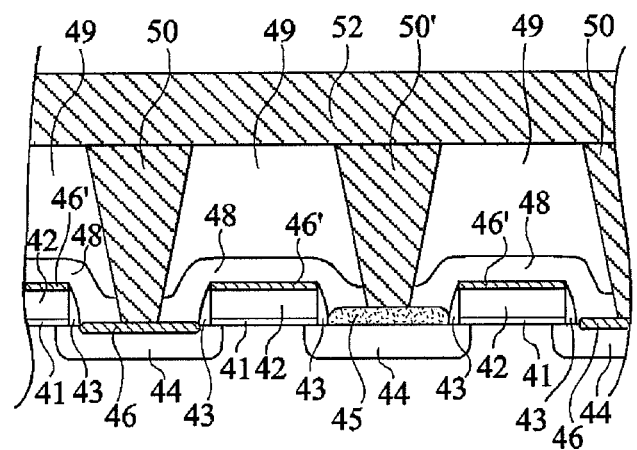
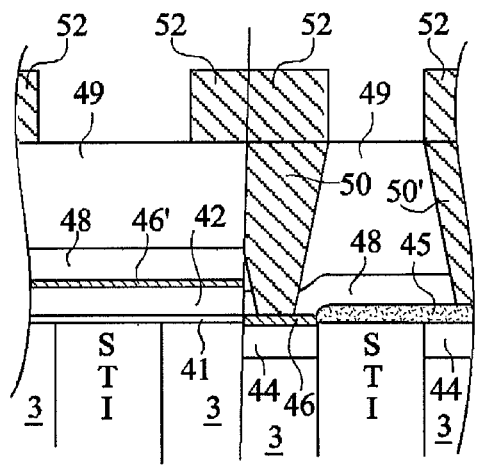
Fig 6H    Fig 7H

LOGIC CODING IN AN INTEGRATED CIRCUIT

BACKGROUND OF THE INVENTION

1. Field of the Invention

The present invention generally relates to integrated circuits and, more specifically, to the non-volatile storage in an integrated circuit of a coding set on manufacturing of this circuit.

An example of application of the present invention relates to non-volatile read-only memories (ROM). Another example relates to logic interconnects within an integrated circuit.

2. Discussion of the Related Art

In many cases, there is a need to definitively code, on manufacturing of the integrated circuit, digital words in a memory or logic states conditioning the circuit operation. For this purpose, a ROM-type memory in which the coding is performed by interconnecting the drain and source of transistors forming the memory cells is generally used, so that the state read from the cell depends on the presence of this connection. The first metallization level of the structure is generally used to perform this programming.

A disadvantage of such a programming is that it is visible by analysis of the mask for forming the interconnection level, for example, by restoring of this mask from a circuit (reverse engineering).

SUMMARY OF THE INVENTION

The present invention aims at overcoming all or part of the disadvantages of known solutions of logic state coding at the manufacturing of an integrated circuit.

An object more specifically is the forming of a read-only memory.

Another object is to make the logic state programming invisible by analysis of the mask for defining the interconnection levels of the structure.

Another object aims at a solution compatible with current circuits for interpreting logic states and especially read-only memories.

To achieve all or part of these objects, as well as others, an embodiment of the present invention provides a method for programming a read-only memory formed of MOS transistors, in which the programming is set by a mask for forming an insulating layer prior to the forming of contacts of active regions of the transistors.

According to an embodiment, the lines for interconnecting several transistors in series in a first direction are formed, with a pattern independent from the programming, in said conductive level.

According to an embodiment, said insulating layer is an oxide and nitride bilayer.

The present invention also provides an interconnection structure between two logic levels of an integrated circuit, comprising, between an active region on a semiconductor substrate and a via connected to an upper conductive level, an insulating layer for masking a lack of interconnection.

The present invention also provides a read-only memory cell formed of a MOS transistor, in which the programming state is set by the presence or not of an insulating layer between an active region and a conductive contact recovery via towards an upper conductive level.

The present invention also provides a read-only memory.

According to an embodiment, tracks for interconnecting drain and source contacts of the transistors in a first direction are uninterrupted.

The foregoing and other objects, features, and advantages of the present invention will be discussed in detail in the following non-limiting description of specific embodiments in connection with the accompanying drawings.

BRIEF DESCRIPTION OF THE DRAWINGS

FIGS. 6A, 6B, 6C, 6D, 6E, 6F, 6G, and 6H are cross-section views in a first direction of intermediary states of a read-only memory manufacturing mode;

FIGS. 7A, 7B, 7C, 7D, 7E, 7F, 7G, and 7H are cross-section views in a second direction of intermediary states of a read-only memory manufacturing mode.

DETAILED DESCRIPTION

Figure 1:
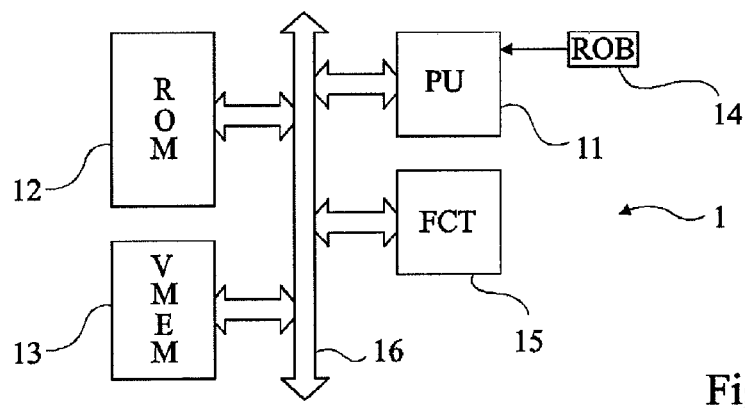
FIG. 1 is a partial block diagram of an integrated circuit of the type to which the present invention applies as an example.

The same elements have been designated with the same reference numerals in the different drawings which have been drawn out of scale.

For clarity, only those steps and elements which are useful to the understanding of the present invention have been shown and will be described. In particular, the steps of manufacturing of an integrated circuit to form memory points storing states in non-volatile fashion have not been detailed other than to refer to usual steps of the manufacturing of such elements. Further, what use is made of the read-only memories and of the logic interconnects has not been detailed either, said use being compatible with any usual use of such circuits.

FIG. 1 is a block diagram of an integrated circuit 1 of the type to which the present invention applies as an example. A processing unit 11 (PU) communicates with read-only memories 12 (ROM) storing, for example, programs to be executed by this processing unit. Unit 11 also exploits one or several volatile memories 13 (VMEM), for example, a RAM. In the example shown in FIG. 1, one or several read only bits ROB are stored in specific circuits 14. These may be, for example, logic interconnects formed in the integrated circuit or isolated read-only memory cells. Such bits have been illustrated separately from memory 12 to underline a possibility of implementation not only in a memory (array network) but also on interconnect nodes isolated from other elements.

Other functions (block 15, FCT) are contained in integrated circuit 1 and depend on the application of this circuit. All these elements communicate via one or several address, data, and control buses 16, possibly completed with direct connections between different circuit elements. As a variation, memory 12 is a circuit separate from the circuits accessing thereto.

Figure 2:
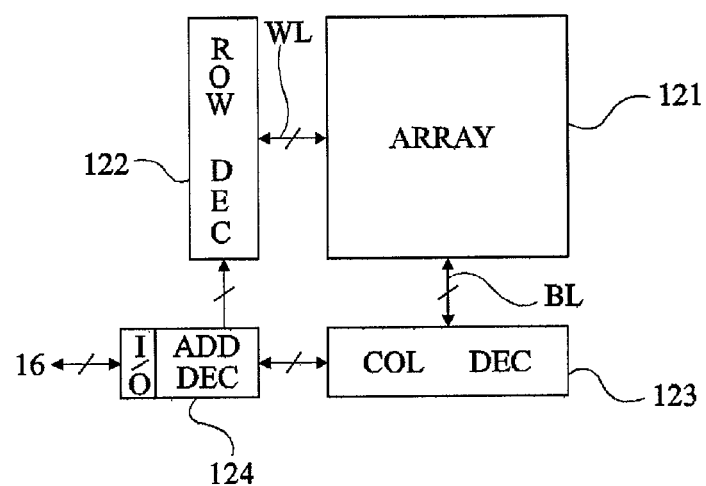
FIG. 2 is a block diagram of a read-only memory to which the present invention applies.

FIG. 2 is a block diagram of a read-only memory 12 of the type to which the present invention applies as an example. An array 121 of memory cells distributed in lines and in columns is exploited by a row decoder 122 (ROW DEC) defining, with its conductors, word lines (WL). A column decoder combined with sense amplifiers (block 123, COL DEC/SA) exploits the data by columns and defines bit lines BL of the structure. The row and column decoders are exploited by a control circuit 124 comprising an address decoder (ADD DEC) and input/output circuits (I/O) connected, for example, to buses 16 (FIG. 1).

Figure 3:
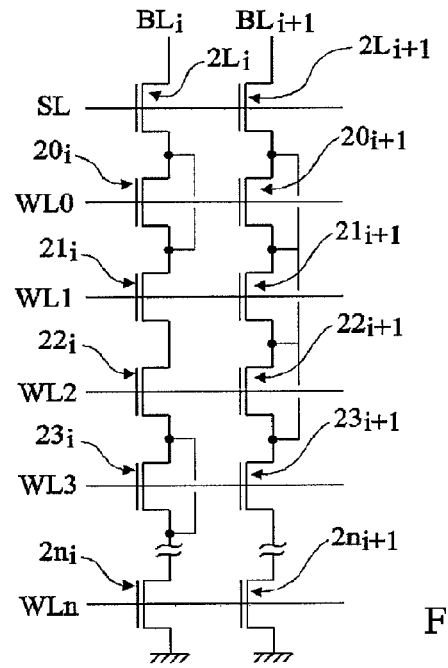
FIG. 3 is a partial electric diagram of the cell network of FIG. 2.

FIG. 3 is a partial electric diagram of a memory cell array of the type in FIG. 2. Each cell 2 is formed by a MOS transistor having its gate connected to word line WL and having its drain and source respectively connected to the drain and source of the transistors forming the previous and next cells. The transistors are thus in series in the column direction. In FIG. 3, transistors 2 have been identified by the rank 0, 1, 2, 3, . . . n of word line WL and by the rank i, i+1 (with i ranging from 0 to m) of the bit line. The array then comprises (n+1)*(m+1) cells. Transistors $20_i$ and $20_{i+1}$ of the first row (WL0) have their drains connected, via transistors $2L_i$ and $2L_{i+1}$ of an array selection row, to bit lines BLi and BLi+1, while those $2n_i$ and $2n_{i+1}$ of the last row (WLn) have their sources connected to a reference voltage (generally, the ground). The programming of each cell is performed, on manufacturing, by short-circuiting or not the drain and source of its transistor. In the example of FIG. 3, transistors $20_i$ and $23_i$ of column i and transistors $20_{i+1}$, $21_{i+1}$, and $22_{i+1}$ of column i+1 are forced to the on state. The logic state 0 or 1 to which this corresponds depends on the read circuit.

In reading, it is generally started by selecting a bit line by means of the column decoder (FIG. 2). Then, selection line SL is brought to a positive voltage with respect to the reference voltage. Conductor WL of the row of the addressed cell is then forced to the reference voltage to select said line, all other word lines being at a greater voltage (for example, at a high circuit supply voltage). This turns on all the transistors in the rows other than the selected one. If transistor 2 of the cell defined by the intersection of the addressed row and column is short-circuited, the word line signal has no effect. Accordingly, the corresponding bit line discharges through the ground connection. If the transistor has not been short-circuited, it isolates the bit line from the ground, and the output amplifier of this line thus sees a high state.

Figure 4:
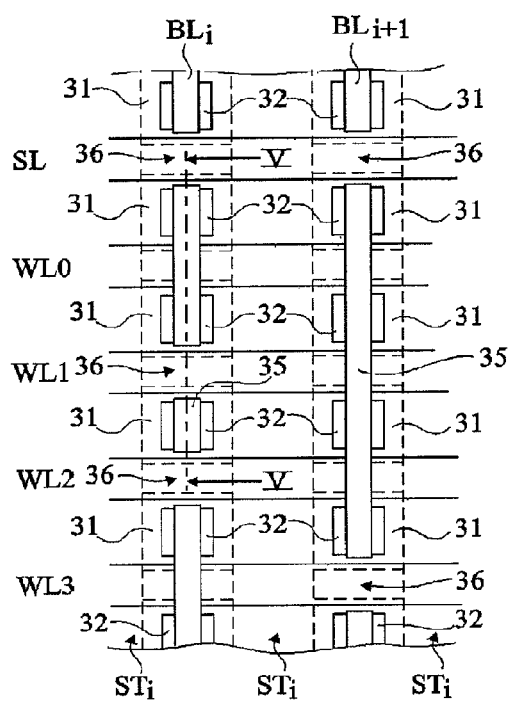
FIG. 4 is a top view of the partial network of FIG. 3 programmed in usual fashion.

FIG. 4 is a partial top view illustrating a usual way to form a read-only memory cell array and to program it to fulfil the electric function of FIG. 3.

Figure 5:
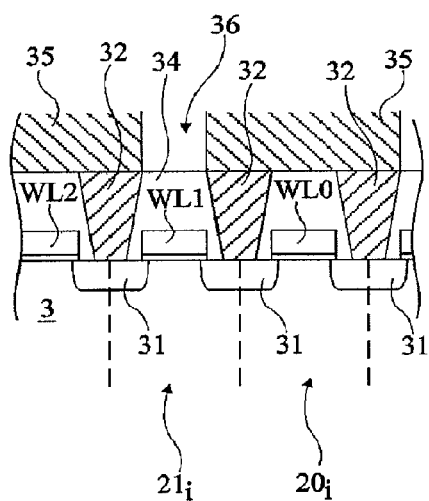
FIG. 5 is a cross-section view of the network of FIG. 4.
Figure 7A:
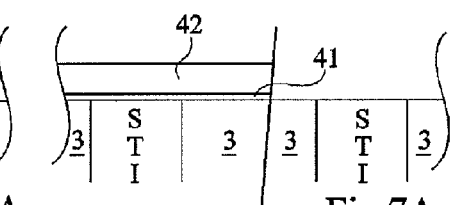
Figure 7B:
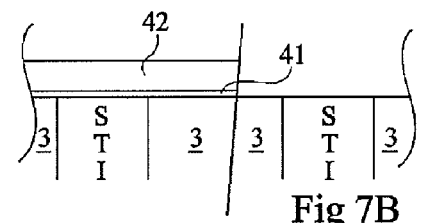

FIG. 5 is a partial cross-section view along stripe-dot line V-V of FIG. 4.

The transistors are formed in a wafer of a semiconductor material (for example, silicon) in which STI trenches isolate the transistor columns from one another. Active drain and source regions 31 of a first conductivity type (for example, N) are formed in wells 3 (FIG. 5) of a second conductivity type (for example, P) laterally delimited by STI insulation trenches (FIG. 4). The transistor gates are formed, for example, of polysilicon on a gate oxide according to a row conductor pattern in a direction perpendicular to that of the columns. The drain and source contacts are recovered by conductive vias 32 across the wafer thickness, formed above regions 31 in an insulating layer 34. Then, conductive tracks 35 are formed to interconnect vias 32 in the column direction. The programming is performed at this level (generally, the first metallization level) by defining, in the mask for forming tracks 35, interruption areas above the gates of the transistors which are not to be short-circuited. In the portion visible in FIGS. 4 and 5, such interruptions 36 are provided between the drain and source contact recovery vias of transistors $2L_i$, $21_i$, $22_i$, $2L_{i+1}$, and $23_{i+1}$. An upper conductive level, not shown, (for example, the second metallization) is generally used to connect the drains of the selection transistors to the sense amplifiers.

The memory plane programming is visually detectable by the pattern of the conductive level in which interruptions 36 are formed. This visual inspection is easy by restoring the mask of the first metallization.

FIGS. 6A, 6B, 6C, 6D, 6E, 6F, 6G, and 6H are cross-section views in a first direction (parallel to the bit lines) illustrating intermediary states of an implementation mode of the read-only memory manufacturing method.

FIGS. 7A, 7B, 7C, 7D, 7E, 7F, 7G, and 7H are cross-section views in a second direction (parallel to the word lines) perpendicular to the first one, of the intermediary states respectively illustrated in FIGS. 6A to 6H. In FIGS. 7A to 7H, the left-hand portions in the orientations of the drawings (line L-L of FIG. 6A) show cross-section views taken on a word line while the right-hand portions (line R-R of FIG. 6A) show cross-section views taken between two word lines.

As previously, it is started from a wafer of a semiconductor material (for example, silicon) in which STI insulating trenches are formed (FIG. 7A) between wells 3 of a conductivity type (for example, type P) in a first direction (for example column direction of the array network). An oxide layer 41 is grown on the wafer (future gate oxide) and a polysilicon layer 42 is deposited on this oxide. Then, polysilicon 42 and gate oxide 41 are etched to define the gate lines (FIGS. 6A and 7A) according to the row pattern (word lines) in the direction perpendicular to the STI trenches of the substrate, to define the transistors. A first (LDD or Low Doped Drain) implantation of the areas unmasked by the gate lines is then generally performed.

Oxide and nitride layers are then deposited, then etched to form spacers 43 (FIGS. 6B and 7B) on either side of the gate lines.

Figure 6A:
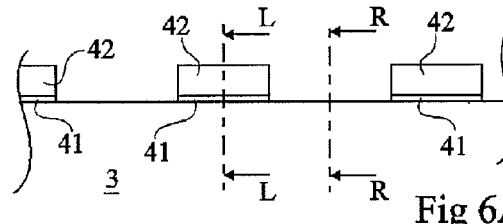
Figure 6B:
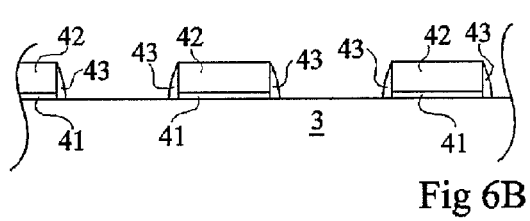
Figure 6C:
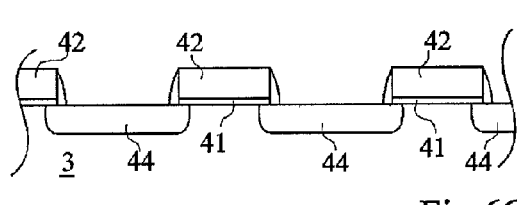
Figure 7C:
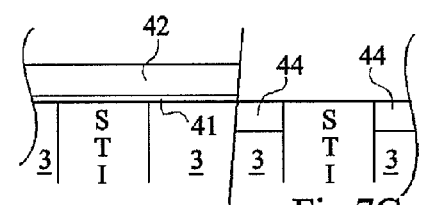

The next step comprises implanting a dopant of another conductivity type (for example, type N) than that of wells 3 to form active source and drain regions 44 of the transistors (FIGS. 6C and 7C).

Then, an oxide layer is deposited, followed by a nitride layer having the function of protecting the silicon of the STI trenches against a subsequent forming of silicide when the gate, drain, and source contacts are formed. Reference will be made hereafter to an oxide-nitride layer 45 to designate this bilayer since the oxide and nitride layers undergo the same processing operations.

Figure 6D:
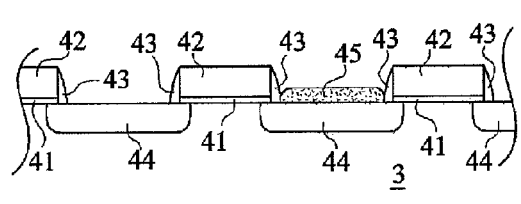
Figure 7D:
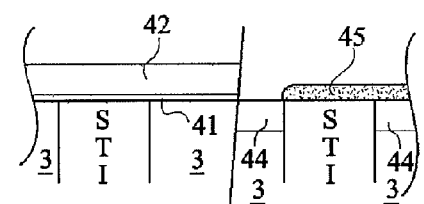
Figure 6E:
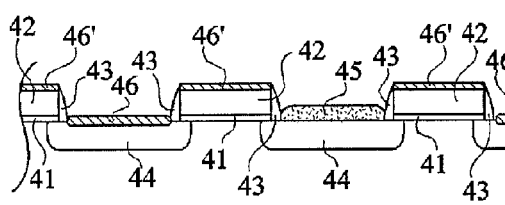
Figure 7E:
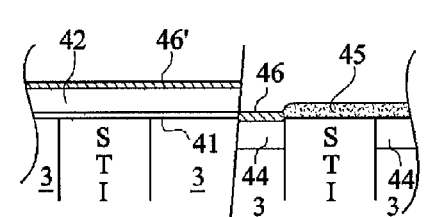

According to this embodiment, layer 45 is etched to remain not only on the STI trench areas uncovered by the gate lines (FIG. 7D), but also on active regions 44 (source/drain) of the transistors which are desired to be programmed in a blocked state (FIGS. 6D and 7D). Indeed, layer 45 is insulating. In the illustrated example, layer 45 remains on the region 44 which is central in FIG. 6D and to the right in FIG. 7D. The thickness of layer 45 is of a few tens of nanometers (for example, between 20 and 50 nanometers).

Layer 45 is then used as a usual contact forming self-aligned mask. The deposition of a metal (for example, cobalt) forms cobalt silicide with silicon everywhere there is polysilicon or silicon. Areas with a low access resistance which form point drain and source contacts 46 (FIGS. 6E and 7E) and gate contact lines 46' are obtained. It can be seen that these contacts have not been formed where the silicon was protected by layer 45. Indeed, the presence of nitride prevents the metal/silicon reaction and preserves insulating layer 45.

The contact recovery by higher conductive levels (metallizations) remains to be formed. This forming usually involves forming conductive vias in an insulating layer placed on the structure. For this purpose, a nitride layer 48 having the function of making the contact etch selective is first deposited full plate. Then, an insulating layer 49 (oxide) is deposited full plate and both layers 49 and 48 are etched according to a via pattern above each active area 44. In practice, a first plasma etch selective for nitride is performed with an adapted gas mixture. Then, when layer 48 is reached, the gas mixture is modified to carry on the etching, which is this time selective for oxide, to reach contacts 46 as well as, outside the memory plane, the ends of lines 46'. Metal is then deposited in the obtained holes to form conductive contact recovery vias 50 (FIGS. 6G and 7G). However, when they are above area 45, vias 50' only contact an insulator. Oxide-nitride layer 45 also prevents the contact-forming etch from reaching the silicon, which would result in creating leakage currents.

Finally, a first metallization is performed according to a track pattern 52 interconnecting vias 50 and 50' in the bit line direction, that is, parallel to the STI trenches. Other conductive levels (metallizations), not shown, are then formed to form the different connections to the rest of the circuit.

Figure 8:
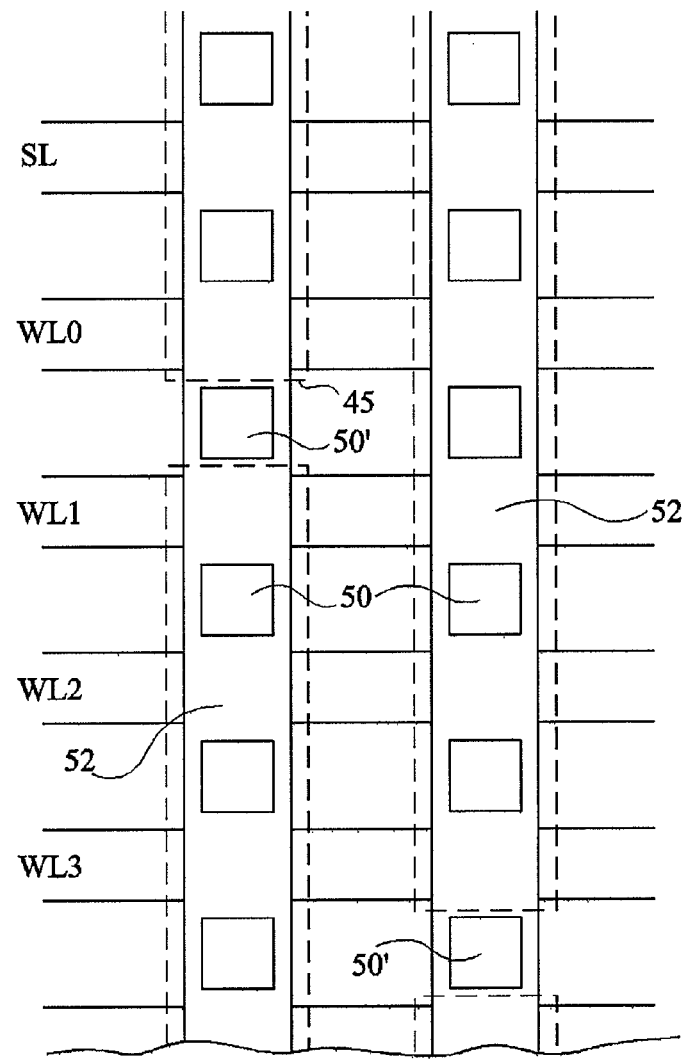
FIG. 8 is a top view of an embodiment of a partial network respecting the electric function of FIG. 3.

FIG. 8 is a top view of the structure formed with the electric function example of FIG. 3. Part of the details of the preceding drawings have not been illustrated. The pattern of layer 45 is symbolized by dotted lines.

As compared to the forming of FIGS. 4 and 5, interconnect tracks 52 are not interrupted for the programming. Accordingly, the memory programming is invisible from above metallization 52 or by analysis of the mask for forming this metallization, or else by performing successive cuttings to restore the mask (delayering).

No additional mask, nor any additional step are required in the memory manufacturing.

Further, the performed programming is under the vias, which makes it even more difficult to detect. Each memory line would indeed have to be cut to identify which contacts are really connected.

Further, it may be provided to add parasitic patterns to prevent a possible analysis of the mask for forming layer 45, for example, by forming such patterns in the STI insulation trenches. Such spurious patterns formed from layer 45 enable defining dummy interconnects which may also be contacted.

Specific embodiments of the present invention have been described. Various alterations and modifications will occur to those skilled in the art. In particular, although the present invention has been described in relation with a read-only memory in the form of an array network, it may be implemented in any area of the integrated circuit above a contact recovery. Further, it may be provided to form areas 45 which insulate active regions of a transistor to invisibly force or forbid a logic connection between elements of the integrated circuit.

Further, the practical implementation of the present invention is within the abilities of those skilled in the art based on the functional indications given hereabove, by adapting the discussed method to variations linked to the application and to the used technology. In particular, other compounds may be used to form insulating areas 45 preventing the forming of the active region contacts (for example, an oxide monolayer with an etching of controlled depth without using the oxide-nitride selectivity), and other conductive materials than metals may be used, provided to be compatible with the described functionalities.

Finally, the present invention applies whatever the type of conductivity of the channel of the formed MOS transistors and whatever the biasings used for the reading.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for programming a read-only memory comprising MOS transistors, the method comprising:
    forming a patterned first insulating layer overlying at least some active regions of the transistors; and
    forming vias for contacts to each of the active regions of the transistors in at least one second insulating layer overlying the first insulating layer.

2. The method of claim 1, wherein lines for interconnecting several transistors in series in a first direction are formed, with a pattern independent from the programming, in a conductive level.

3. The method of claim 1, wherein said insulating layer is an oxide and nitride bilayer.

4. A read-only memory cell comprising:
    a MOS transistor;
    a first insulating layer; and
    a second insulating layer, wherein the programming state is set by the presence or not of the first insulating layer between an active region of the MOS transistor and a conductive contact via of the second insulating layer and the conductive contact via is present for each active region of the transistor.

5. A read-only memory comprising at least one cell as claimed in claim 4.

6. The memory of claim 5, further comprising uninterrupted tracks for interconnecting drain and source contacts of a plurality of transistors in a bit line direction, wherein the programming of the memory cannot be determined when viewing the memory.

7. The method of claim 1, further comprising:
    depositing the at least one second insulating layer on the patterned first insulating layer.

8. The method of claim 1, further comprising:
    forming uninterrupted interconnect tracks in a bit line direction, wherein the programming of the read-only memory cannot be determined when viewing the interconnect tracks.

9. The memory cell of claim 4, wherein the first insulating layer comprises nitride.

10. The memory cell of claim 4, wherein the first insulating layer is between 20 and 50 nanometers.

11. The memory cell of claim 4, wherein the first insulating layer is disposed on an active region.

12. The memory cell of claim 4, wherein the second insulating layer comprises oxide.

13. A method for programming read-only memory comprising acts of:
    patterning a first insulating layer to cover at least some active regions of an array of MOS transistors of the read-only memory;
    depositing a second insulating layer; and
    etching vias to each active region of the MOS transistors in the second insulating layer.

14. The method of claim 13 further comprising acts of:
    depositing contact material in the vias; and
    forming uninterrupted interconnect tracks in a bit line direction, wherein a presence of the first insulating layer over any one active region prevents electrical contact between the one active region and an interconnect track.

15. The method of claim 13, wherein the patterning of the first insulating array defines the programming of the read-only memory.

16. Read-only memory comprising an array of MOS transistors organized according to bit lines, wherein contact vias are formed along a bit line extending from the bit line to each source and drain region of each MOS transistor along the bit line regardless of stored data.

17. The read-only memory of claim 16, wherein contact material is deposited in the vias.

18. The read-only memory of claim 16, further comprising a patterned insulating layer underlying at least some of the contact vias.

19. The read-only memory of claim 18, wherein the thickness of the patterned insulating layer is between 20 nm and 50 nm.

20. The method of claim 13, wherein the MOS transistors are organized according to bit lines and the etching comprises etching vias to each source and drain region of each MOS transistor in a bit line.

\* \* \* \* \*